(12) United States Patent
Barmoav et al.

(10) Patent No.: US 7,128,140 B2
(45) Date of Patent: Oct. 31, 2006

(54) HEAT SINKS

(75) Inventors: Felix Barmoav, Rishon Leziyyon (IL); Yair Alon, Holon (IL); Haim Slotin, Oranit (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/961,937

(22) Filed: Oct. 8, 2004

(65) Prior Publication Data
US 2005/0087326 A1    Apr. 28, 2005

(30) Foreign Application Priority Data
Oct. 22, 2003    (GB) .................................. 0324560.2

(51) Int. Cl.
*H05K 7/20*    (2006.01)
(52) U.S. Cl. ..................... 165/185; 165/80.3; 257/722; 361/697; 361/704
(58) Field of Classification Search ............... 165/80.3, 165/121, 122, 185; 174/16.3; 257/722; 361/697, 704
See application file for complete search history.

(56) References Cited

U.S. PATENT DOCUMENTS

| | | | |
|---|---|---|---|
| 3,592,260 A | | 7/1971 | Berger |
| 4,953,634 A | | 9/1990 | Nelson et al. |
| 5,095,973 A | * | 3/1992 | Toy .............................. 165/185 |
| 5,676,198 A | * | 10/1997 | Schneider et al. .......... 165/80.3 |
| 5,734,552 A | * | 3/1998 | Krein ......................... 165/80.3 |
| 6,213,195 B1 | * | 4/2001 | Downing et al. ........... 165/80.4 |
| 6,253,834 B1 | * | 7/2001 | Sterner ...................... 165/80.3 |
| 6,253,835 B1 | * | 7/2001 | Chu et al. .................... 165/185 |
| 6,330,153 B1 | * | 12/2001 | Ketonen et al. ........... 165/80.3 |
| 6,333,852 B1 | * | 12/2001 | Lin ............................. 361/697 |
| 6,364,009 B1 | * | 4/2002 | MacManus et al. ........ 165/185 |
| 6,371,200 B1 | * | 4/2002 | Eaton ......................... 165/80.3 |
| 6,400,012 B1 | * | 6/2002 | Miller et al. ................ 361/697 |
| 6,418,020 B1 | | 7/2002 | Lin |
| 6,450,251 B1 | * | 9/2002 | Lin et al. ..................... 165/122 |
| 6,501,651 B1 | * | 12/2002 | Lin et al. ..................... 361/697 |
| 6,704,199 B1 | * | 3/2004 | Wiley ......................... 361/695 |
| 2002/0174980 A1 | | 11/2002 | Dibene, II et al. |
| 2005/0063159 A1 | * | 3/2005 | Ma ............................. 361/704 |

FOREIGN PATENT DOCUMENTS

WO    WO 99/27761 A1    6/1999

* cited by examiner

*Primary Examiner*—Leonard R. Leo

(57) ABSTRACT

A heat sink (100) includes a cooling block (105) having a plurality of fins (110) extending through the block to provide a series of coolant channels (112) extending between the fins, the channels having in the interior of the block a venturi narrowing. Beneficially, the channels have coolant entry regions in at least two different regions (115, 120) of the block to direct a plurality of coolant flows into the interior of the block from different directions.

Also described is a method of cooling a device such as a processor of a mobile computer used in a vehicle by placing the heat sink or more than one of the heat sinks adjacent to the device to be cooled, preferably with a region in which the venturi narrowing of the coolant channels is provided close to the hottest part of the device to be cooled.

16 Claims, 3 Drawing Sheets

HEAT SINKS

FIELD OF THE INVENTION

This invention relates to heat sinks. In particular, the invention relates to heat sinks for cooling electronic devices such as processing units of mobile computers used in vehicles.

BACKGROUND OF THE INVENTION

The processing units of computers need to be kept cool so that they can operate within their performance specification. For computers used in vehicles this can be particularly challenging since, depending on the geographical region where the computer is used, the ambient temperature may be relatively high. Also, computing devices are being designed which consume more power for the same size of device. Typically, an in-vehicle computer generates waste heat at a rate of about 30 W and the case of the processor of the computer can only withstand a maximum temperature of about 100° C. The need for cooling generally increases the longer such a computer is being continuously used. In view of these requirements, which are becoming increasingly difficult to satisfy, there is a need for an improved efficiency heat sink to provide cooling of a processor unit in a mobile computer.

Heat sinks are known which are in the form of a cylindrical block having coolant channels formed between fins extending though the heat sink. Generally, the channels are formed so that the flow of coolant is generally from a single coolant inlet region and in one direction.

US-A-2002/0174980 describes a cylindrical block heat sink in which fins extend longitudinally through the heat sink to provide coolant flow generally in one direction. The fins change shape and are concentrated to provide improved cooling in a hotspot region, but the channels are generally of uniform width.

SUMMARY OF THE INVENTION

In accordance with a first aspect of the present invention, there is provided a heat sink including a cooling block having a plurality of fins extending through the block to provide a series of coolant channels extending between the fins, the channels having in the interior of the block a venturi narrowing. The fins provide in an interior region of the block at least a first coolant channel and a second coolant channel which are adjacent to one another and adapted such that coolant flows in the first and second coolant channels in different directions. The coolant channels preferably reach their narrowest in a region in the interior of the block in which an area between inner walls of the block correspondingly reaches a minimum, thereby concentrating the channels and improving the cooling effect by the channels in this region.

At least some of the fins may beneficially be curved or bent.

The channels may have coolant entry regions in at least two different regions of the block to direct a plurality of coolant flows into the interior of the block.

The heat sink may include a partition extending between a first outer surface region of the block and a second outer surface region of the block to separate coolant flows. The coolant entry regions may be such that coolant flows adjacent to the partition are in opposite directions. The partition may extend diagonally through the block.

The block may have a cylindrical shape and coolant entry regions may be provided at opposite ends of the cylinder to direct flows of coolant toward the interior of the block from the opposite ends. The ends may be perpendicular to an axis of the cylinder. Alternatively, the ends may be sloping at an acute angle to an axis of the cylinder, e.g. sloping toward a common intersection region on one side of the block. The cylinder of the cylindrical block may have a cross-sectional shape perpendicular to axis an of the block which is square or rectangular, although it could have another suitable shape such as circular, elliptical, polygonal, or trapezoidal.

The coolant channels formed between the fins may have coolant exit regions in which the channels are narrower than in the coolant entry regions. The channels may be wider in the coolant exit regions than in regions where they have venturi narrowing. In the case where the block is cylindrical, the coolant exit regions may be on sides of the block extending between the cylinder ends. The partition may extend diagonally between (i) a first edge between a first end of the cylinder and a first side of the cylinder and (ii) a second edge between a second end of the cylinder and a second side of the cylinder. The coolant entry regions may be provided at the first and second ends and the coolant exit regions may be provided at the first and second sides.

In the region where the coolant channels reach their narrowest in the interior of the block, i.e. where their diameter reaches a minimum, the area between (bounded by) the inner walls of the block, i.e. the area occupied by the series of channels, correspondingly reaches a minimum. This beneficially provides concentration of the coolant flow or flows to enhance efficiency of cooling in this region.

Apart from the coolant entry and exit regions, the block of the heat sink is preferably a closed container to contain the coolant flows within the coolant channels. The block may be made of a conducting material such as aluminium, magnesium or copper.

In use, the heat sink is placed adjacent to a device to be cooled, such that the hottest part of the device is close to the interior of the block where the venturing narrowing of the channels is provided. The coolant delivered through the coolant channels may conveniently be air, but other suitable known coolant gases or liquids may be employed to take away heat from the interior of the block. Coolant may be forced along the channels in a known way. For example, fans may be provided adjacent to the coolant inlet regions to direct coolant through the coolant channels.

In accordance with a second aspect of the present invention, there is provided a method of cooling a device which includes providing at least one heat sink according to the first aspect adjacent to the device. The hottest part of the device to be cooled is preferably positioned as close as possible to the region of the heat sink in which the coolant channels are narrowest. The device may be an electronic device such as a processor of a computer. The computer may be a mobile computer such as one used in a vehicle.

In the method according to the second aspect of the invention, coolant may be forced into the channels, e.g. by fans located adjacent to the coolant inlet regions.

Coolant may be delivered into the channels at a substantially constant flow rate. Alternatively, coolant may be delivered under substantially constant pressure.

As illustrated later, the heat sink and method according to the invention can provide improved performance in the cooling of a device such as a processor of a mobile computer compared with prior art heat sinks and so meets the need for an improved heat sink compared with the prior art.

Embodiments of the present invention will now be described by way of example only, with reference to the accompanying drawings, in which:

BRIEF DESCRIPTION OF THE ACCOMPANYING DRAWINGS

DESCRIPTION OF EMBODIMENTS OF THE INVENTION

Figure 1:
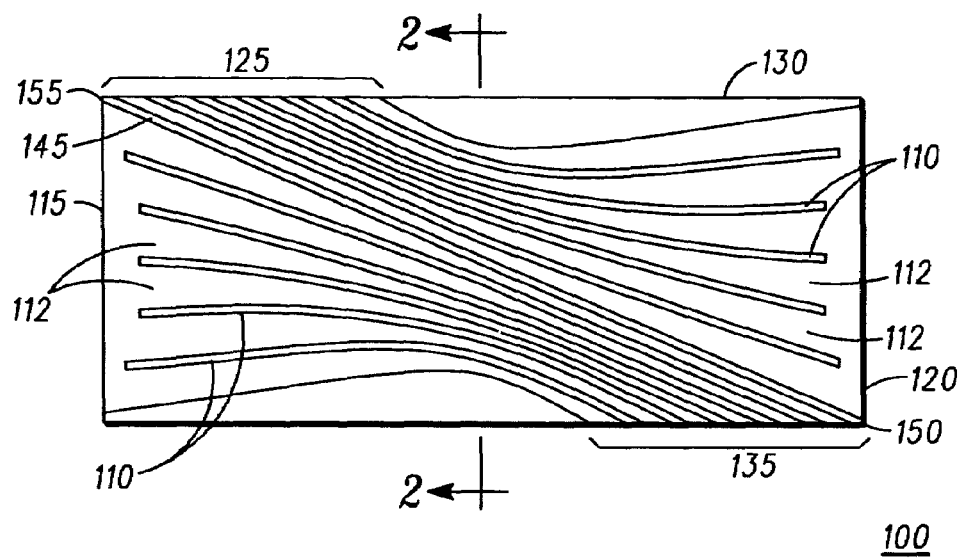
FIG. 1 is a cross-sectional side view of a cylindrical heat sink embodying the invention.
Figure 2:
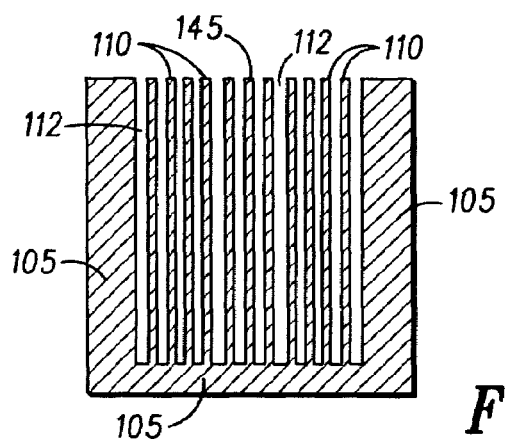
FIG. 2 is a cross-sectional end view of the heat sink shown in FIG. 1 as seen in the plane defined by the line II—II in FIG. 1.
Figure 3:
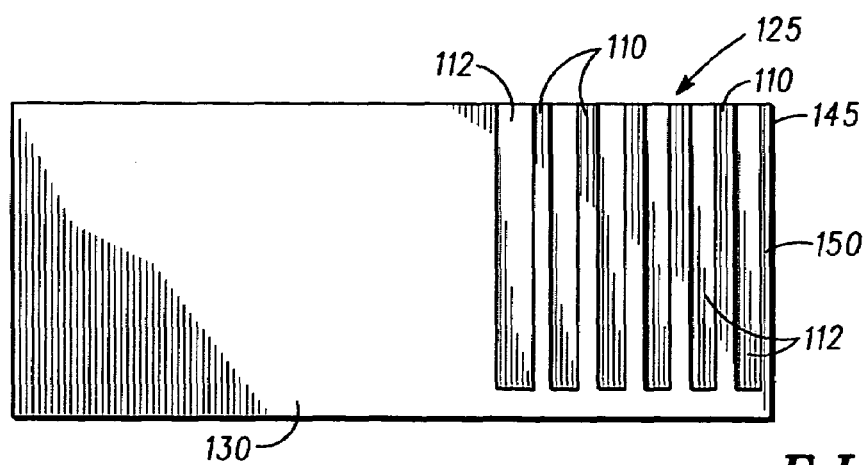
FIG. 3 is a plan view of the heat sink shown in FIG. 1.
Figure 4:
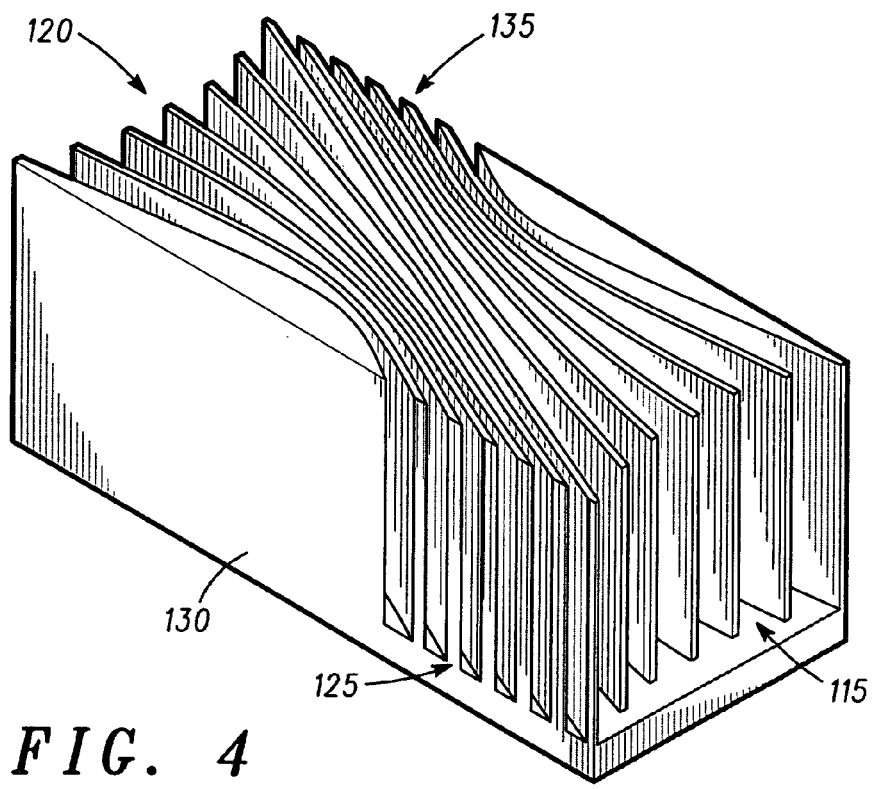
FIG. 4 is a perspective top view of the heat sink shown in FIG. 1.

FIGS. 1 to 4 show the construction of a heat sink 100 embodying the invention. The heat sink 100 comprises a rectangular cylindrical block made of metal. Three side walls 105 of the block are shown in FIG. 2. In practice, there is a fourth side wall which has been removed in FIGS. 2 and 4 to show the interior of the heat sink 1. Fins 110 extend through the heat sink 100 and provide coolant channels 112 between the fins 110. There are coolant entry regions at each of opposite ends 115 and 120 of the heat sink 100. In these regions, the channels 112 have a widened diameter. The diameter of the channels 112 becomes gradually constricted as the channels 112 reach a midway region between the ends 115, 120 approximately defined in FIG. 2 by the position of the line II—II. The channels 112 extending from the end 120 reach a coolant exit region 125 formed in a top face 130 as seen in FIGS. 3 and 4. The channels 112 extending from the end 115 reach a coolant exit region 135 formed in a bottom face 140.

Near the coolant exit regions 125 and 135 the channels 112 have a diameter which is slightly greater than midway along their length but less than the diameter near the inlet regions at the ends 115 and 120.

A partition 145 extends diagonally through the interior of the heat sink 100 from (i) an edge 150 between the end 120 and the exit region 135 to (ii) an edge 155 between the end 115 and the exit region 125. The partition 145 serves to separate the channels 112 having an inlet region at the end 115 and the channels having an inlet region at the end 120. The fins 110 and channels 112 have a curvature which becomes greater as their distance from the partition 145 increases. The fin 110 nearest the partition 145 and above the partition as shown in FIG. 1 and the fin 110 nearest the partition 145 and below the partition as shown in FIG. 1 can be considered to form the first and second channels (in this case channels 112) referred to earlier providing coolant flow in substantially opposite directions on the two opposite sides of the partition 145.

Figure 5:
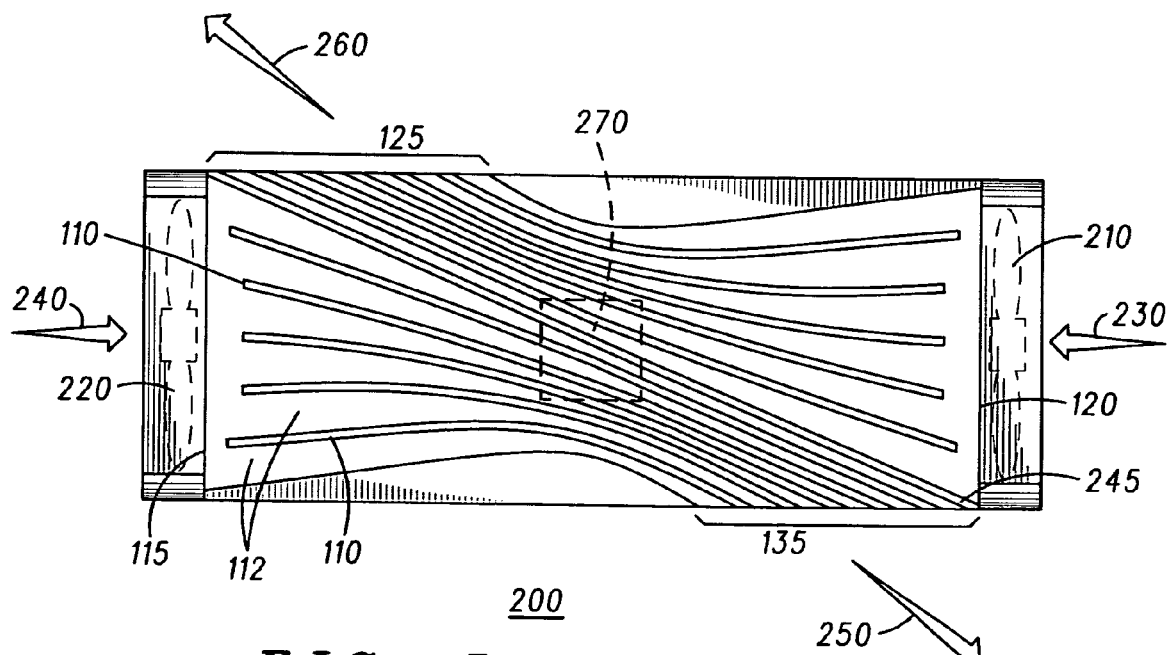
FIG. 5 is a cross sectional side view of a heat sink embodying the invention in use.

FIG. 5 shows a heat sink 200 similar to the heat sink 100 of FIGS. 1 to 4 in which similar parts have the same reference numerals. In FIG. 5, the partition 145 is replaced by a thicker partition 245. A device to be cooled is positioned below the heat sink 200 with the hottest part of the device indicated by dashed line 270 closest to the central region of the heat sink 200 where the channels 112 are narrowest and closest together as a series. Fans 210 and 220 are provided respectively at the coolant inlet regions at the respective ends 120 and 115. The fans deliver air along the channels 112 in flows indicated by arrows 230 and 240. Thus, there is a first flow indicated by arrow 230 directed toward the central region inside the heat sink 200 from the end 120 and a second counter flow indicated by arrow 240 directed toward the central region inside the heat sink 200 from the end 115. The partition 245 separates the two flows. The first flow indicated by arrow 230 leaves the heat sink 200 via coolant exit region 125. The second flow indicated by arrow 240 leaves the heat sink 200 via coolant exit region 135. The air delivered into the heat sink 200 in the manner described above may be provided in a known manner at a constant flow rate or, alternatively, under constant pressure.

Figure 6:
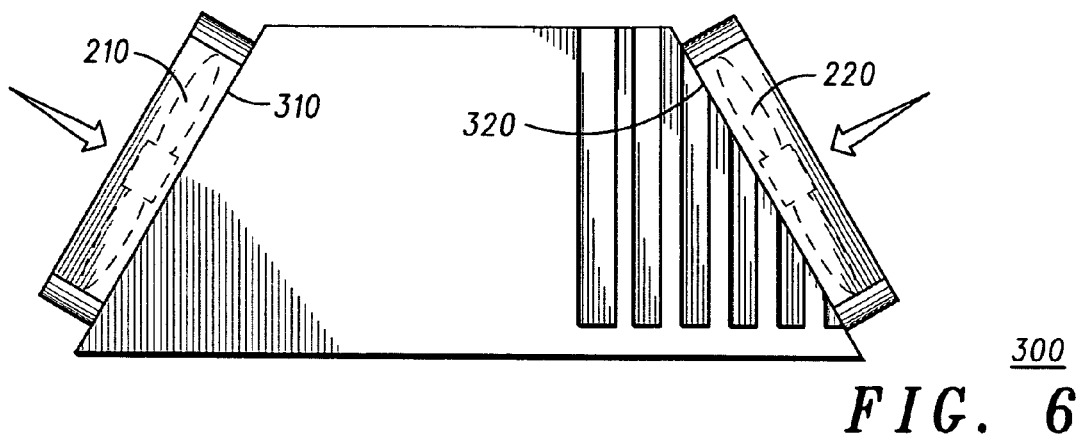
FIG. 6 is a side view of an alternative heat sink in use.

FIG. 6 shows an alternative heat sink 300. In this case, ends 310, 320 respectively of the block forming the heat sink 300 are sloping inward rather than perpendicular to an axis of the heat sink 300. The fans 210, 220 are again present. The heat sink 300 operates generally in the manner described with reference to FIG. 5.

In order to demonstrate improved cooling efficiency using heat sinks embodying the invention, an experiment was carried out as follows. A heat sink similar to the heat sink 200 of FIG. 5 was investigated in comparison with a prior art heat sink of similar dimensions having parallel straight fins and channels. The heat sinks were made of aluminium and had outer dimensions of 145×65×60 mm and a base thickness (employed nearest the heat source) of 5 mm. An electrical resistor heat source was provided to generate a power dissipation of 30 W or alternatively 70 W. A thermocouple was provided in each case to monitor temperature near to the heat source. The thermocouple was fitted through a hole provided in the base plate of the heat sink. Coolant air was provided in each case by a constant flow ventilator having dimensions 60×60×25 mm. Two ventilators were used in each case. The air flow was approximately 25 cubic feet per minute (0.0283 cubic metres per minute) in each case. The temperature monitored by the thermocouple in each case was recorded as a function of time. Using a 70 W heat source the prior art heat sink provided a steady state temperature which was about 39° C. above the measured ambient temperature. In contrast, the heat sink embodying the invention provided a steady state temperature which was only about 24° C. above the measured ambient temperature. Also, using a 35 W heat source the prior art heat sink provided a steady state temperature which was about 18° C. above the measured ambient temperature. In contrast, the heat sink embodying the invention provided a steady state temperature which was only about 11° C. above the measured ambient temperature. Thus the improved cooling efficiency using the heat sink embodying the invention was demonstrated.

Figure 7:
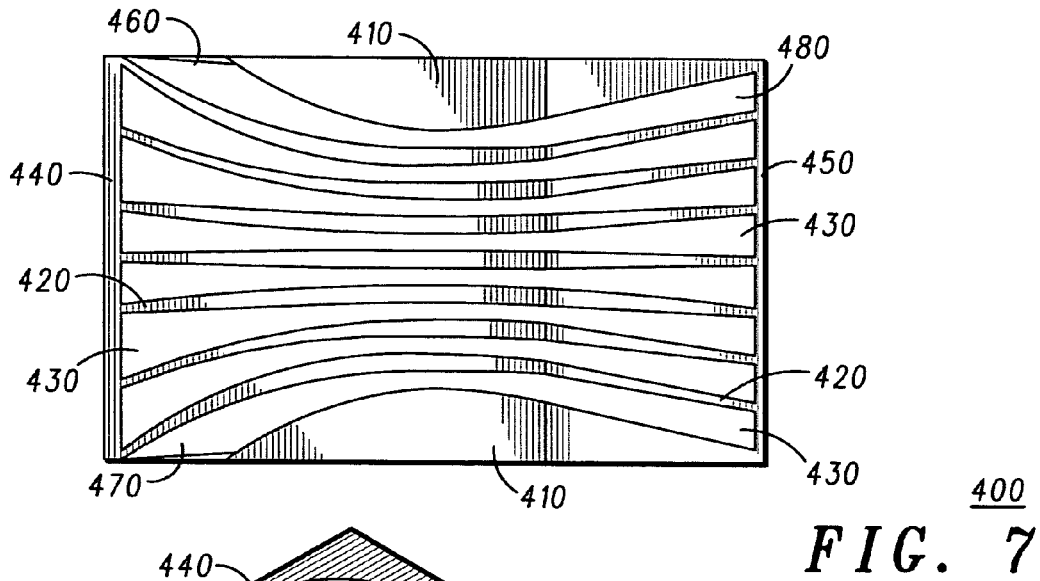
FIG. 7 is a cross-sectional side view of a simpler form of heat sink embodying the invention.
Figure 8:
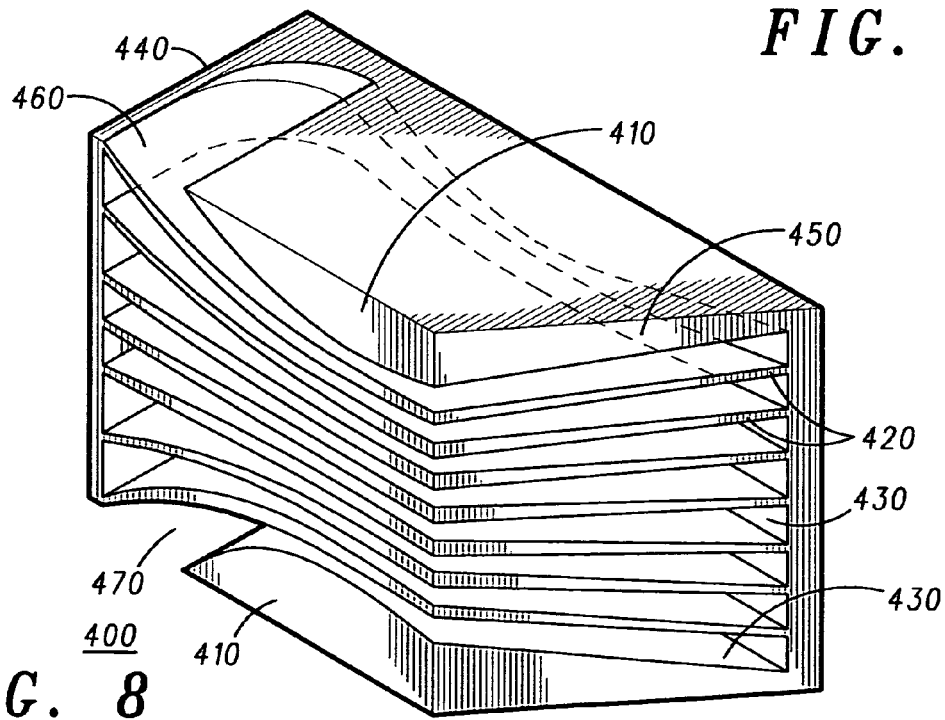
FIG. 8 is a partly cut away perspective view of the heat sink of FIG. 7.

FIG. 7 shows a simplified form of heat sink 400. In this case, the heat sink comprises a cylindrical block having side walls 410 which have a greatest thickness midway along the length of the block. Curved fins 420 extend through the block with channels 430 between the fins 420. The channels have a venturi narrowing midway along the block where the side walls 410 are thickest and the area between the side walls 410 reaches a minimum to concentrate the channels into that area. The block of the heat sink 400 has ends 440, 450 which may be perpendicular to the axis of the block or may slope inward as shown on FIG. 8. The channels 430 nearest the side walls 410 have inlet regions 460, 470 respectively appearing in the side walls. Likewise, the channels 430 nearest the side walls 410 have outlet regions 480, 490 respectively appearing in the side walls. The main inlet region is at the end 440 and the main outlet region is at the end 450.

In use, the heat source 400 provides coolant flow in a single general direction from the coolant inlet region (e.g. end 440) of the channels 430 to the coolant outlet region (e.g. end 450). The simplified heat sink 400 is not as efficient as the heat sink 200 but is still better than prior art heat sinks having no venturi narrowing of the coolant channels. In any event, improved cooling may be achieved by using two such heat sinks 400.

The benefits of the heat sinks embodying the invention which are described above can be summarised as follows. The speed of coolant is increased by the venturi narrowing and is greatest in the (central) region nearest the hottest region of the device to be cooled. The coolant inlet volume (channel size) is expanded to decrease system thermal impedance. The number of coolant channels available for cooling is maximised in the (central) region of the heat sink nearest the device to be cooled, particularly by having channels directing collant from different directions. The cooling effect is therefore concentrated in this region. Since at least some of the fins are bent or curved rather than straight the fin surface area and channel length is increased. Since there are two coolant flows in different, e.g. substantially opposite directions, the different flows enhance cooling in the hottest region to be cooled.

The invention claimed is:

1. A heat sink including a cooling block having a plurality of fins extending through the block to provide a series of coolant channels extending between the fins, the channels having in an interior of the block a venturi narrowing, wherein the fins provide in an interior region of the block at least a first coolant channel and a second coolant channel which are adjacent to one another and adapted such that coolant flows in the first and second coolant channels in different directions; and wherein the first and second channels are separated by a partition and the partition extends diagonally through the block.

2. A heat sink according to claim 1 wherein the first and second channels are adapted such that coolant flows in the first and second coolant channels in substantially opposite directions.

3. A heat sink according to claim 1 wherein the first coolant channel and the second coolant channel have coolant inlet regions in different regions of the block to direct coolant into an inner region of the block.

4. A heat sink according to claim 3 wherein the coolant entry regions of the channels are located such that coolant flows adjacent to opposite sides of the partition are in generally opposite directions.

5. A heat sink according to claim 4 wherein the first coolant channel and the second coolant channel have coolant inlet regions adjacent opposite ends of the partition.

6. A heat sink according to claim 1 wherein coolant channels reach their narrowest in a region in the interior of the block in which an area between inner walls of the block correspondingly reaches a minimum.

7. A heat sink according to claim 1 wherein at least some of the fins and the channels between them are curved or bent.

8. A heat sink according to claim 1, wherein the coolant entry regions are provided at opposite ends of the block to direct flows of coolant toward the interior of the block from the opposite ends.

9. A heat sink according to claim 8 wherein the ends of the block are substantially perpendicular to an axis of the block.

10. A heat sink according to claim 8 wherein the ends of the block are sloping at an acute angle with respect to an axis of the block.

11. A heat sink according to claim 8 wherein the block has a shape in cross-section perpendicular to an axis of the block which is square, rectangular, circular, elliptical, polygonal, or trapezoidal.

12. A heat sink including a cooling block having a plurality of fins extending through the block to provide a series of coolant channels extending between the fins, the channels having in an interior of the block a venturi narrowing, wherein the fins provide in an interior region of the block at least a first coolant channel and a second coolant channel which are adjacent to one another and adapted such that coolant flows in the first and second coolant channels in different directions; and wherein the coolant channels formed between the fins have coolant exit regions in which the channels are narrower than in the coolant entry regions.

13. A heat sink according to claim 12 wherein the coolant channels are wider in the coolant exit regions than in regions where they have venturi narrowing.

14. A heat sink according to claim 12 wherein the coolant exit regions are on sides of the block extending between ends of the block.

15. A heat sink according to claim 12 wherein the partition extends diagonally inside the block between (i) a first edge between a first end of the block and a first side of the block and (ii) a second edge between a second end of the block and a second side of the block.

16. A heat sink according to claim 15 wherein the coolant entry regions are provided at the first and second ends of the block and the coolant exit regions are provided at the first and second sides of the block.

* * * * *